United States Patent [19]

Maoz

[11] Patent Number: 4,875,023
[45] Date of Patent: Oct. 17, 1989

[54] VARIABLE ATTENUATOR HAVING VOLTAGE VARIABLE FET RESISTOR WITH CHOSEN RESISTANCE-VOLTAGE RELATIONSHIP

[75] Inventor: Barak Maoz, Highland Park, N.J.

[73] Assignee: Grumman Aerospace Corporation, Bethpage, N.Y.

[21] Appl. No.: 192,193

[22] Filed: May 10, 1988

[51] Int. Cl.$^4$ .............................................. H01P 1/22
[52] U.S. Cl. ................................... 333/81 R; 307/540; 307/550; 307/568
[58] Field of Search ...................... 333/81 R, 81 A; 307/540, 550, 567, 568, 571, 573, 304; 330/284, 277

[56] References Cited

U.S. PATENT DOCUMENTS

| | | | |
|---|---|---|---|
| 3,598,908 | 10/1971 | Poulett | 307/568 X |
| 3,968,452 | 7/1976 | Sahara et al. | 330/29 |
| 3,977,291 | 8/1976 | Southard | 307/567 X |
| 4,004,164 | 1/1977 | Cranford, Jr. et al. | 307/297 |
| 4,016,481 | 4/1977 | Bradley | 323/16 |
| 4,039,981 | 8/1977 | Ohashi et al. | 334/14 |
| 4,088,943 | 5/1978 | Schmidt | 322/90 |
| 4,090,139 | 5/1978 | Hoover | 325/451 |
| 4,093,909 | 6/1978 | Watrous et al. | 323/22 R |
| 4,121,183 | 10/1978 | Murphy | 333/81 R |
| 4,202,238 | 5/1980 | Moog | 84/1.27 |
| 4,241,316 | 12/1980 | Knapp | 330/277 |
| 4,244,043 | 1/1981 | Fujita et al. | 368/85 |
| 4,255,716 | 3/1981 | Takada | 330/284 |
| 4,257,064 | 3/1981 | Colles | 358/169 |
| 4,317,055 | 2/1982 | Yoshida et al. | 307/304 |
| 4,375,596 | 3/1983 | Hoshi | 307/297 |
| 4,395,643 | 7/1983 | Lehmann | 307/264 |
| 4,425,515 | 1/1984 | Larson | 307/268 |
| 4,496,909 | 1/1985 | Knapp | 330/277 |
| 4,546,651 | 10/1985 | Merrick | 73/701 |
| 4,549,098 | 10/1985 | Fushiki | 307/352 |
| 4,549,197 | 10/1985 | Brehm et al. | 357/41 |
| 4,555,788 | 11/1985 | Merrill | 375/11 |
| 4,562,362 | 12/1985 | Stenbock | 307/290 |
| 4,605,912 | 8/1986 | Naster et al. | 333/164 |
| 4,638,190 | 1/1987 | Hwang et al. | 307/512 |
| 4,646,028 | 2/1987 | Palmer | 330/277 |
| 4,649,291 | 3/1987 | Konishi | 307/297 |
| 4,663,584 | 5/1987 | Okada et al. | 323/313 |
| 4,686,387 | 8/1987 | Rumelhard | 307/304 X |
| 4,686,451 | 8/1987 | Li et al. | 323/313 |
| 4,688,113 | 8/1987 | Parsons | 360/67 |
| 4,700,462 | 10/1987 | Beaubien et al. | 436/187 |
| 4,701,722 | 10/1987 | Dolby | 333/14 |
| 4,719,434 | 1/1988 | Scott et al. | 333/32 |

FOREIGN PATENT DOCUMENTS 0122313  6/1987  Japan .............................. 333/81 R

OTHER PUBLICATIONS

Lizama, G. et al., 1–6 GHz GaAs MMIC Linear Attenuator with Integral Drivers, IEEE 1987 Microwave and Millimeter-Wave Monolithic Circuits Symposium, 1987.

Fisher, D. et al., A Linear GaAs MMIC Variable Attenuator, RF Design, Oct. 1987.

*Primary Examiner*—Eugene R. LaRoche
*Assistant Examiner*—Seung Ham
*Attorney, Agent, or Firm*—Scully, Scott, Murphy & Presser

[57] ABSTRACT

A variable attenuator having first and second branch circuits configured in bridged T, T or PI topologies, each of the branch circuits having at least one voltage variable FET resistor. The voltage variable FET resistor includes a FET network comprising a plurality of FET segments each of which have a predetermined gate width and a voltage divider network including a plurality of fixed resistors coupled to the gates of the plurality of FET segments for providing a different predetermined gate voltage to each of the FET segments. The gate width of each of the FET segments and the resistance of each of the fixed resistors is chosen to provide a predetermined relationship between the control voltage and the channel resistance of the voltage variable FET resistor, to thereby provide a preselected relationship between the control voltage applied to the first branch circuit and the attenuation ratio of the attenuator.

31 Claims, 10 Drawing Sheets

VARIABLE ATTENUATOR HAVING VOLTAGE VARIABLE FET RESISTOR WITH CHOSEN RESISTANCE-VOLTAGE RELATIONSHIP

BACKGROUND OF THE INVENTION

This invention relates to voltage variable attenuators and more particularly, to monolithic integrated circuit attenuators using field effect transistors as voltage controlled variable resistors.

In electronic signal processing, a variable attenuator is one of the most versatile and widely applied components. Monolithic integrated circuit (MIC) attenuators utilizing field effect transistors have many advantages over the conventional PIN diode attenuators. PIN diode attenuators have non-linear attenuation versus control voltage characteristics and are very sensitive to control voltages at high attenuation levels. In addition, a complicated linearizing circuit is required for linear operation.

Monolithic microwave integrated circuit (MMIC) variable attenuators have been proposed that can replace PIN diode attenuators. The prior art MMIC variable attenuators utilize FETs as voltage controlled resistors.

The use of a field effect transistor (FET) as a voltage controlled variable resistor is well known. There is a region in the characteristic curve of a FET for small values of the drain to source voltage $V_{DS}$, where the drain current $I_D$ varies linearly with $V_{DS}$. The $V_{DS}$ value must be smaller than the gate to source voltage $V_{GS}$ less the threshold or pinch off voltage $V_T$, i.e. ($V_{GS} - V_T$). The linear relationship between voltage and current allows the FET to be used as a voltage controlled variable resistor. In the linear region, the FET acts as a resistor whose value can be controlled by the gate voltage The drain can be kept either positive or negative with respect to the source when using the FET in this mode, which gives the FET the bilateral property of an ordinary resistor The resistance $R_{DS}$ of the FET in the linear region is given by $$R_{DS} = \frac{V_T^2}{2I_{DSS}(V_{GS} - V_T - \frac{V_{DS}}{2})} \quad (1)$$

The relationship shows the dependence of the resistance $R_{DS}$ on $V_{GS}$. FIG. 1 is a plot of equation 1 showing the relationship between $R_{DS}$ and $V_{GS}$ for a typical single FET designed for use as a voltage controlled resistor. As a negative voltage applied to the gate is increased, the resistance varies substantially linearly between 0.0 and $-2.0$ volts until pinch-off at approximately $-4.0$ volts.

The characteristics of individual FETs fabricated in monolithic form are proportional to the gate width and other manufacturing parameters While the characteristics may vary slightly for individual FETs, the relationship between the resistance and the gate voltage is always in accordance with equation 1. The curve as shown in FIG. 1 may be moved up and down or compressed and expanded, by manufacturing the FET with a gate width that will yield the desired channel resistance However, the resistance-voltage relationship will remain in accordance with equation 1. In the many applications for voltage controlled variable FET resistors, there is often a need for a variable resistor having a voltage versus resistance relationship different than that of equation 1.

An example in the prior art of a monolithic attenuator using FETs as a voltage variable resistors is described by Fisher et al., "A Linear GaAs MMIC Variable Attenuator", RF Design, October 1987. Fisher teaches the use of three single FETs having a gate width based on a trade off between insertion loss and parasitic capacitance In addition, complicated external analog control circuitry is required to apply the desired gate voltages to each FET. The control circuitry includes active components requiring D.C. power to drive the circuit.

Another prior art attenuator using a FET resistor is disclosed by Lizama, et al., "1-6 GHz GaAs MMIC Linear Attenuator With Integral Drivers", IEEE 1987 Microwave and Millimeter-Wave Monolithic Circuits Symposium. Lizama, et al. uses two FETs in parallel having different gate widths to provide improved linearity of attenuation. Lizama, et al. uses a complex integrated driver circuit consisting of active elements to provide the various gate voltages This driven circuit also requires D.C. power, substantially increasing the cost of the attenuator, and its sensitivity to temperature variations and process changes.

SUMMARY OF THE INVENTION

The present invention is directed to a MMIC attenuator using field effect transistors as voltage controlled variable resistors. The FET resistors of the invention have almost any chosen resistance versus voltage relationship allowing the attenuator to be designed with a preselected relationship between the attenuation and the control voltage. The relationship may be linear or as desired depending on the particular application. The MMIC attenuator of the invention may be implemented in any topology, such as T, PI or bridged T. The attenuator of the invention comprises a first branch circuit coupled to a source terminal and a load terminal and a second branch circuit coupled to the first branch circuit and a common terminal. The first and second branch circuits each include at least one voltage variable FET resistor coupled within the circuit.

The voltage variable FET resistors of the invention include a FET network comprising a plurality of FET segments having source, drain and gate electrodes The individual FET segments of the FET network are electrically coupled in parallel to each other. The drain electrodes of each of the FET segments are coupled to an output terminal of the FET network and the source electrodes of each of the FET segments are coupled to an input terminal of the FET network. The gate electrodes of each of the FET segments are coupled to a control voltage terminal of the voltage variable FET resistor upon which a control voltage is applied. The voltage variable FET resistor of the invention also includes a voltage divider network coupled to the gate electrodes and the control voltage terminal The voltage divider network divides the control voltage to provide a different predetermined gate voltage to the gate electrode of each FET segment. The FET resistors of the invention are also disclosed in co-pending U.S. application Ser. No. 192,340, by the same inventor and assigned to the same assignee as the present application, said application being filed concurrently herewith.

The plurality of FET segments are connected in parallel and therefore, the resistance measured between the output and input terminals of the FET network is the equivalent resistance of the channel resistances between the source and drain of each of the FET segments. The channel resistance of each FET segment is inversely proportional to the gate width of each gate electrode. The gate electrode of each of the FET segments has a predetermined gate width which is selected to provide the desired resistance-voltage relationship of the voltage variable FET resistor in a manner to be described hereinafter.

By providing the individual FET segments with different gate widths, each FET segment will have a different relationship between the voltage applied to the gate and the channel resistance. Each of the individual FET segments of the FET network has a channel resistance that is variable as a function of the different gate voltage applied to the FET segment by the voltage divider network. In addition, the range in which the channel resistance varies is a function of the predetermined gate width of each of the FET segments Thus, in accordance with the invention, the relationship between the resistance measured between the output and input terminals and the control voltage is determined by varying the gate widths of the plurality of FET segments and the gate voltages applied to each of the FET segments The variation in the gate widths of the FET segments is provided by fabricating the voltage variable FET resistor of the invention with each FET segment having a predetermined gate width. Typically, the gate width of at least one of the FET segments is different from the gate width of at least one other of the FET segments The variation in the gate voltages applied to the FET segments is made by the design of the voltage divider network. The voltage divider network includes a plurality of fixed resistors with at least one resistor coupled to the gate of each FET segment In a voltage variable FET resistor of the invention having n FET segments, where n is greater than or equal to 2, the voltage divider network will include n fixed resistors. The voltage divider network is formed with the $n^{th}-1$ resistor connected between the gate electrodes of the $n^{th}-1$ and the $n^{th}$ FET segment. The $n^{th}$ resistor connected between the gate electrode of the $n^{th}$ FET segment and a common or ground terminal The values of the fixed resistors are selected to divide the control voltage and for providing the desired gate voltage to each of the FET segments The voltage divider network is a passive circuit that does not require any D.C. power to provide the desired gate voltages, except for a small current determined by the resistor values.

The present invention is implemented in monolithic technology due to the greater control in fabricating the FET segments of varying gate widths In one embodiment, the FET segments are metal semiconductor field effect transistors (MESFET) having a Shottky gate and using interdigitated source, drain and gate electrodes. For microwave frequency operation, the FET should be fabricated on a gallium arsenide (GaAs) substrate. At lower frequencies, silicon may be used. The voltage divider resistors can be integrated monolithically on the same chip, and are much simpler to implement than the prior art control circuitry.

DETAILED DESCRIPTION OF THE PREFERRED EMBODIMENT

Figure 1:
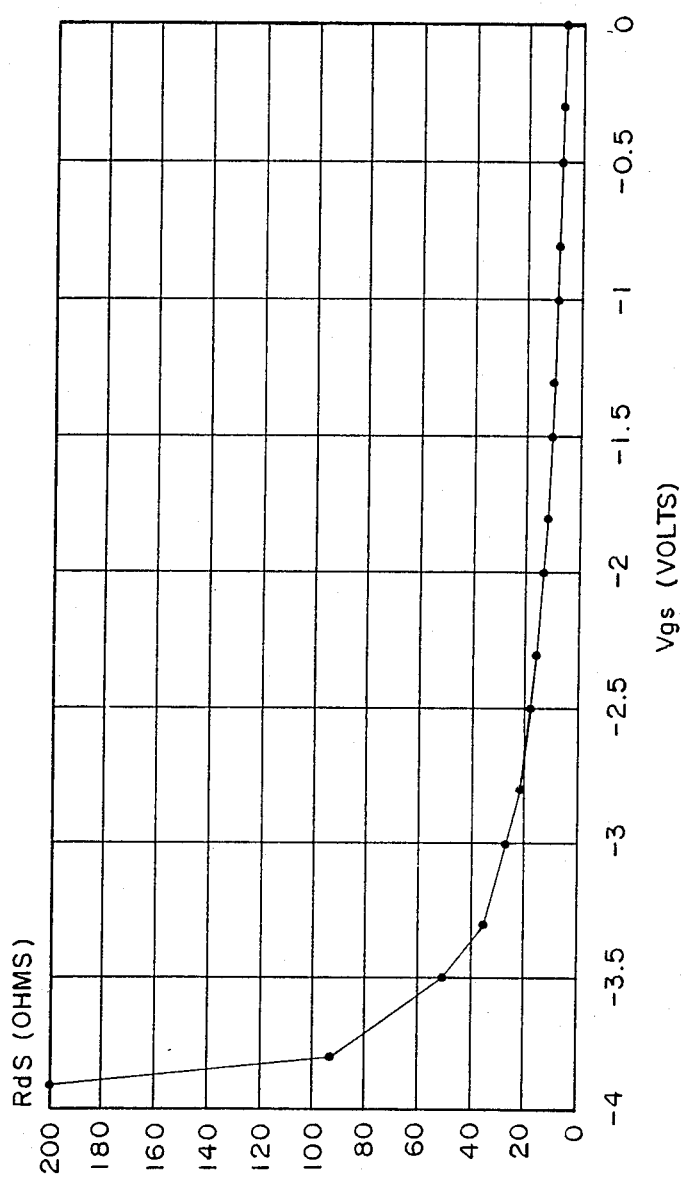
FIG. 1 is a graph showing the resistance versus voltage relationship of a single voltage variable FET of the prior art.
Figure 2:
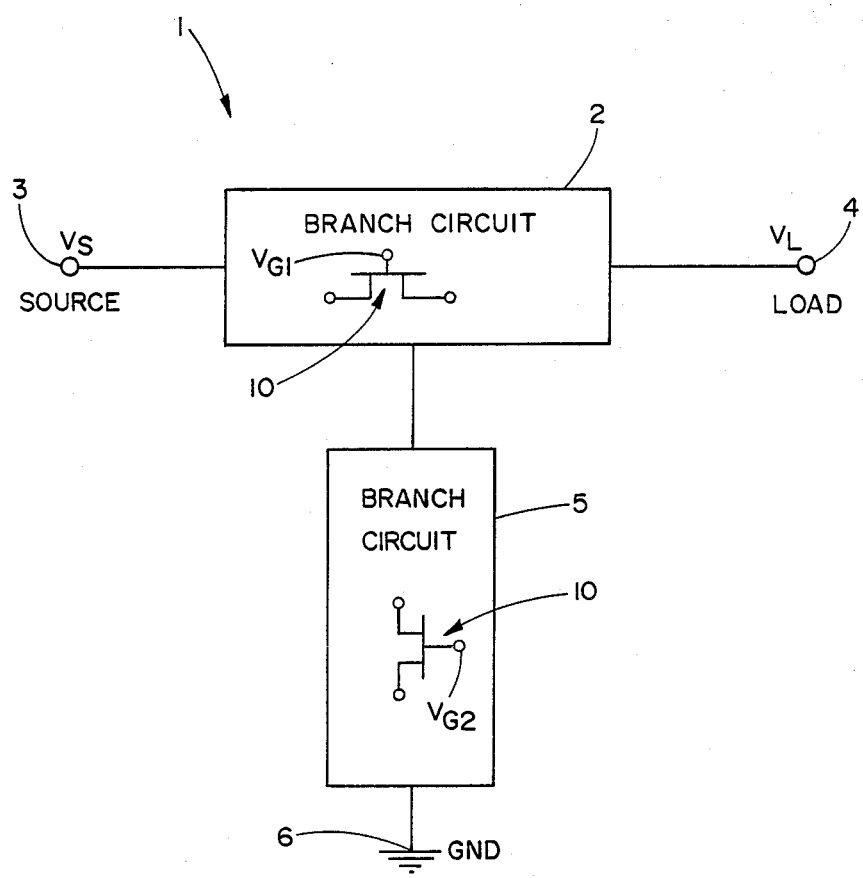
FIG. 2 is a schematic block diagram of the variable attenuator of the invention.

The variable attenuator of the invention is shown in a schematic block diagram in FIG. 2 in which the attenuator 1 includes a first branch circuit 2 coupled to a source terminal 3 and a load terminal 4. The attenuator 1 also includes a second branch circuit 5 coupled to the first branch circuit 2 and a common terminal 6, shown in the illustrative embodiment of FIG. 2 as, ground. Each of the first and second branch circuits 2 and 5 include a voltage controlled variable FET resistor 10.

Figure 3:
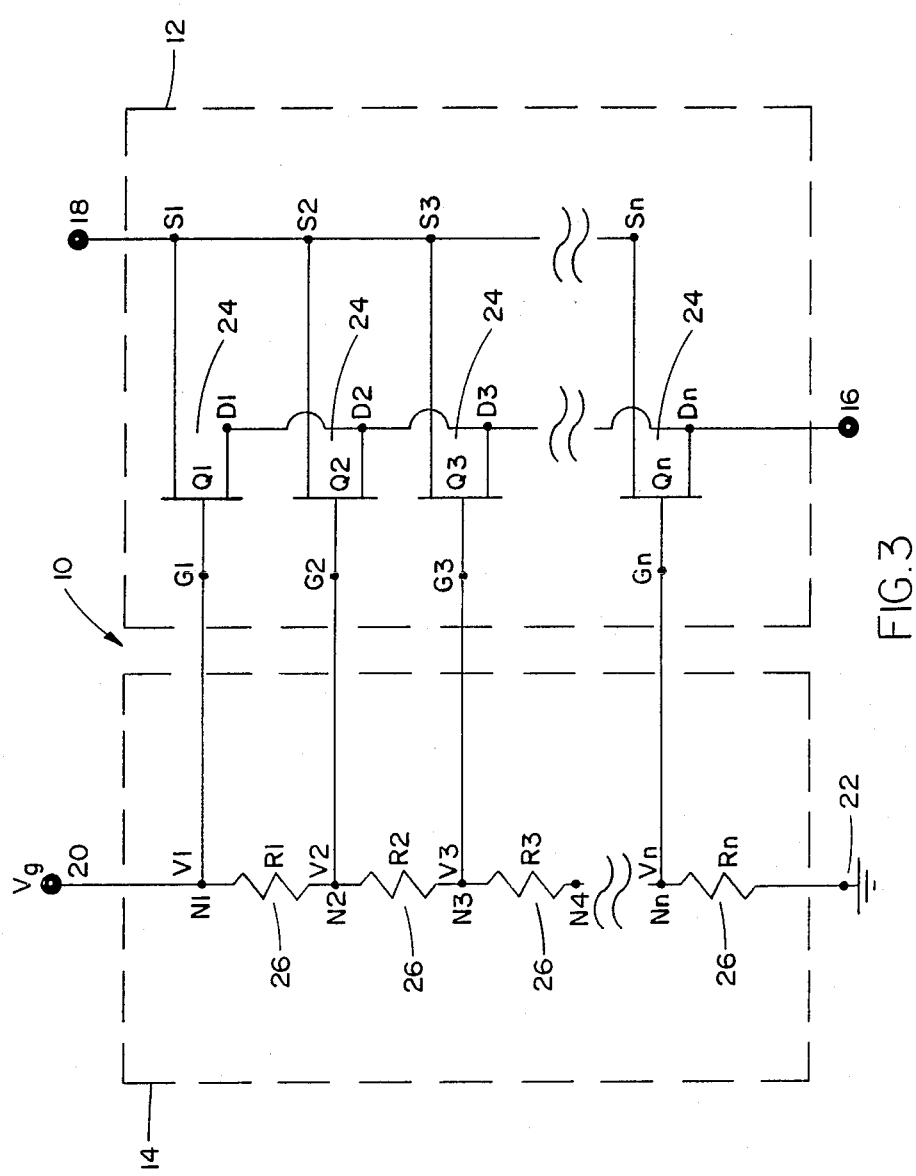
FIG. 3 is a schematic circuit diagram of the voltage controlled variable FET resistor used in the attenuator of the present invention.

The voltage controlled variable FET resistors 10 of the present invention have a flexibility in design to allow the selection of any channel resistance versus control voltage relationship desired. FIG. 3 shows a schematic circuit diagram of the voltage variable FET resistor 10 of the invention comprising a FET network 12 coupled to a voltage divider network 14. The FET network 12 includes an input terminal 16 and an output terminal 18. The voltage divider network 14 is coupled to a voltage control terminal 20 and to a ground terminal 22.

The FET network 12 comprises a plurality of FET segments 24 having source (S), drain (D) and gate (G) electrodes. The FET segments 24 are designated $Q_1$, $Q_2$, $Q_3 \ldots Q_n$ and have source, drain and gate electrode designed $S_1$, $S_2$, $S_3 \ldots S_n$; $D_1$, $D_2$, $D_3 \ldots D_n$; and $G_1$, $G_2$, $G_3 \ldots G_n$, respectively. The number, n, of FET segments in the FET network 12 is determined in accordance with the particular application and desired voltage-resistance relationship of the FET resistor 10.

Each of the FET segments 24 in the FET network 12 are coupled in parallel across their respective source and drain electrodes. Accordingly, all the source electrodes $S_1$, $S_2$, $S_3 \ldots S_n$ are coupled together to output terminal 18, and all the drain electrodes $D_1$, $D_2$, $D_3 \ldots D_n$ are coupled together to input terminal 16.

The voltage divider network 14 includes a plurality of fixed resistors 26 coupled to the gate electrodes of the FET segments 24 between control terminal 20 and ground terminal 22. The gate electrodes $G_1$, $G_2$, $G_3 \ldots G_n$ are coupled to the voltage divider network 14 at nodes $N_1$, $N_2$, $N_3 \ldots N_n$. Resistor R1 of the plurality resistors 26 is coupled between node N₁ and N₂. Similarly, resistor R2 is coupled between nodes N₂ and N₃ and resistor R₃ is connected between nodes N₃ and N₄. Resistor $R_n$ is connected between node $N_n$ and ground terminal 22.

As stated above, a field effect transistor operating in the linear range of its I-V characteristic curve acts as a voltage controlled variable resistor. The resistance measured between the source and drain electrodes varies in accordance with the voltage applied to the gate of the transistor. In addition, the range of resistance values is dependent upon manufacturing parameters and in particular, the width of the gate of the FET. Each of the FET segments 24 in the network 12 have a predetermined gate width resulting in a predetermined channel resistance measured between the source and drain of each FET segment. The FET network 12 includes at least two or more FET segments 24 in which the gate width of at least one of the FET segments 24 is different from the gate width of at least one other of the FET segments 24.

The FET segments 24, are connected in parallel and therefore the resistance of the FET resistor 10 measured between terminals 16 and 18 is the equivalent resistance of the FET segments determined by the parallel resistance formula:

$$\frac{1}{R_{DS}} = \frac{1}{R_{DS1}} + \frac{1}{R_{DS2}} + \frac{1}{R_{DS3}} + \ldots + \frac{1}{R_{DSn}} \quad (2)$$

A control voltage $V_G$ applied to the control terminal 20 will be divided by the voltage divider network 14 to provide a different voltage to each of the gates of the FET segments 24. The individual gate voltages are designated $V_1, V_2, V_3 \ldots V_n$, where $V_1$ equals $V_G$. The individual gate voltages can be derived directly by using the voltage divider formula $$V_i = \frac{V_G \times (R_i + R_{i+1} + \ldots + R_n)}{R_1 + R_2 + R_3 + \ldots + R_n} \quad (3)$$

where $i = 1, 2, \ldots n$

As a result of the different gate voltages applied to each of the FET segments 24, each FET segment 24 will have a different relationship between $V_G$ and the resistance measured between the source and drain of each FET segment 24. Since the source and drain terminals of each of the FET segments 24 are connected in parallel, the resulting resistance of the complete voltage variable FET resistor 10 can be made to match a specified relationship by changing the number of FET segments 24, the width of each of the FET segments 24 and the voltage divider network 14 resistance values.

Figure 4:
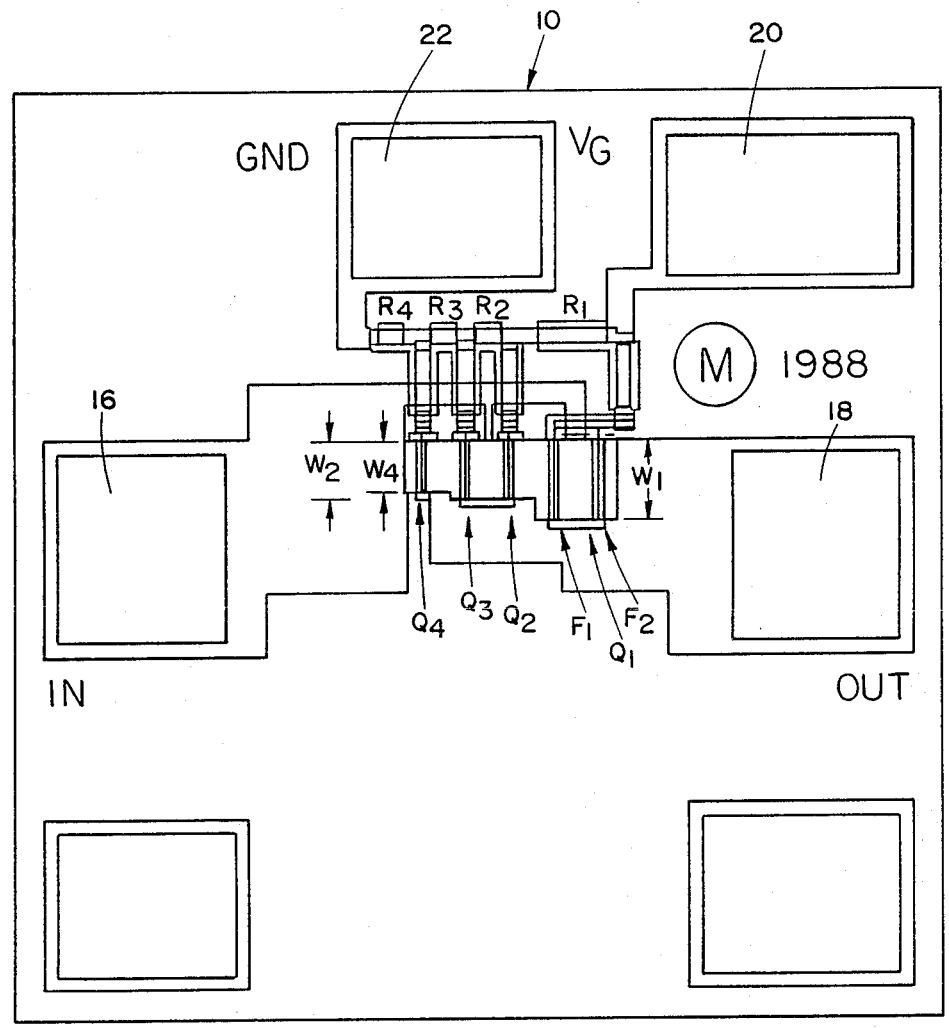
FIG. 4 is a "calma" layout describing a plan view of the voltage controlled variable FET resistor used in the attenuator of the present invention in monolithic form.

Referring now to FIG. 4, the voltage variable FET resistor 10 is shown in monolithic form. The plurality of FET segments 24 are formed on a semiconducting substrate, such as GaAs from electrodes having an interdigitated construction. In the illustrative monolithic embodiment of FIG. 3, the FET segment $Q_1$ is shown with a gate width $2W_1$. FET segment $Q_1$ is a split FET which is made of two segments $F_1$ and $F_2$ coupled to the same metal strip thus connecting the two segments in parallel The effective gate width of FET segment $Q_1$ is equal to the gate width of segment $F_1$ plus the gate width of segment $F_2$. FET segment $Q_2$ and $Q_3$ have a gate width of $W_2$ and FET segment $Q_4$ has a gate width $W_4$. Resistors $R_1$, $R_2$, $R_3$ and $R_4$ are connected as shown to the gates of FET segments $Q_1$-$Q_4$, between control terminal contact pad 20 and ground terminal contact pad 22. The drain electrodes of the FET segments $Q_1$-$Q_4$ are connected to input contact pad 16 and the source electrodes of the FET segments $Q_1$-$Q_4$ are connected to output terminal contact pad 18.

In implementing the invention, the desired voltage-resistance relationship necessary for a particular application is first determined. The desired relationship may be based on the need to have the resistance between the input and output terminals of the FET resistor 10 vary in a particular manner upon the application and change of the control voltage $V_G$. By using a combination of the known equivalent parallel resistance formula and the voltage divider formula of equation 3, one skilled in the art can determine the number of FET segments of the FET network 12, the required gate width for each of the FETs and the resistance values for the voltage divider network 14 to construct a voltage controlled variable FET resistor having the desired voltage-resistance relationship. A computer simulation program may be used to simulate the resistance-voltage relationship of FET resistor 10 for various combinations of gate widths and fixed resistor values to assist in ascertaining the optimal combination.

The following is a table of values for the implementation of the FET resistor 10 of the invention shown in FIG. 4.

TABLE

| RESISTANCE | GATE WIDTHS |
|---|---|
| $R_1$ = 4.5 k ohms | $W_1$ = 110 microns (2 × 55) |
| $R_2$ = 1.9 k ohms | $W_2$ = 40 microns |
| $R_3$ = 1.7 k ohms | $W_3$ = 40 microns |
| $R_4$ = 1.6 k ohms | $W_4$ = 35 microns |

Figure 5:
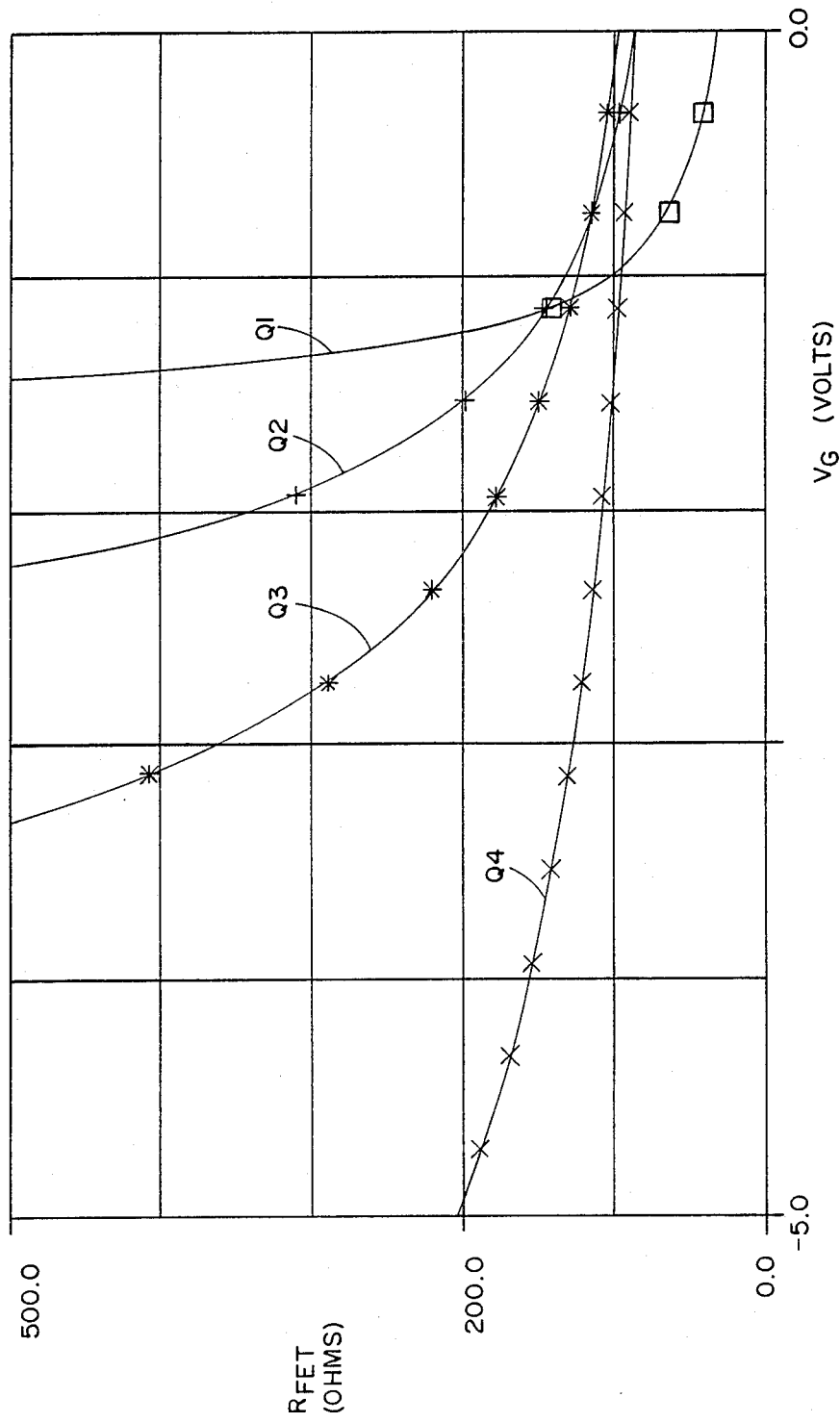
FIG. 5 is a graph showing the voltage versus resistance relationships of each of the individual FET segments of a voltage controlled variable FET resistor used in the attenuator of the present invention.
Figure 6:
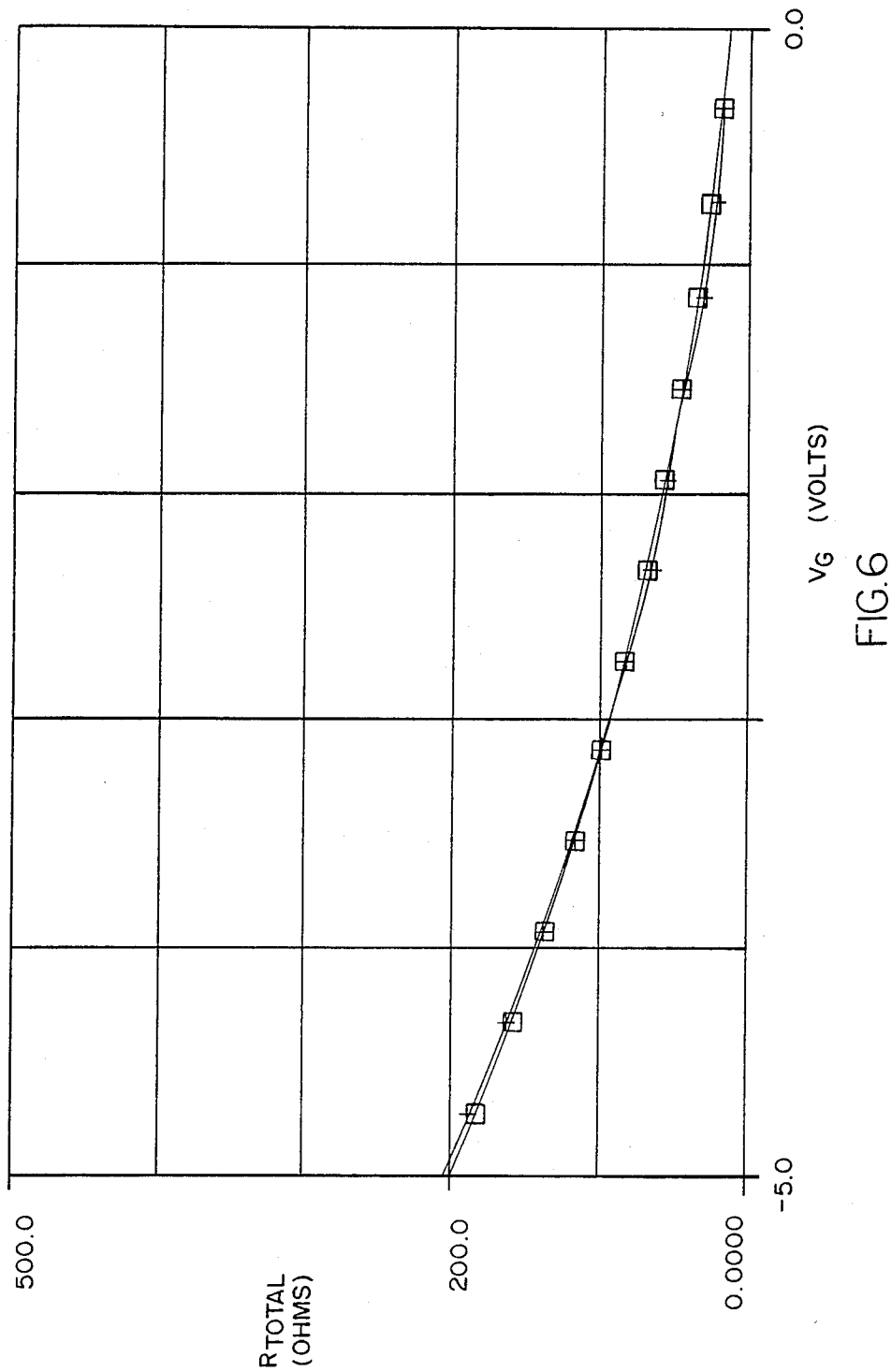
FIG. 6 is a graph showing the resistance versus voltage relationship of a voltage controlled variable FET resistor used in the attenuator of the present invention.

FIG. 5 is a graph showing the relationships between voltage and channel resistance for each of the individual FET segments $Q_1$-$Q_4$. For a control voltage in the range of 0.0 to −5.0 volts, the resistance for each FET segment varies in accordance with each of the plots shown. The size of the gate width affects the channel resistance in a manner such that a larger width will produce a smaller resistance. As the channels are coupled in parallel, in accordance with Ohms Law, a smaller parallel resistance will have a larger contribution to the equivalent resistance. The resistors of the voltage divider 14 determine when each FET segment will reach pinch off state. Once a FET segment reaches pinch off, the resistance becomes very large and no longer contributes to the equivalent resistance. As shown in FIG. 5, between 0.0 and −1.0 volts, all four of the FET segments have values that contribute to the equivalent resistance. However, between −3.0 and −4.0 volts, only $Q_3$ and $Q_4$ contribute and between −4.0 and −5.0 volts only $Q_4$ will contribute. FIG. 6 is a graph showing the equivalent resistance of the complete FET resistor 10 as a function of the control voltage. Thus, in accordance with the invention, the relationship between the resistance measured between the output and input terminals and the control voltage may be determined by varying the number of FET segments, the gate widths of the FET segments and the gate voltages applied to the FET segments.

The flexibility in design of the voltage controlled variable FET resistors 10 permits the variable attenuator of the invention to have almost any chosen relationship between the attenuation and the control voltage. Referring again to FIG. 2, a signal with amplitude $V_S$ is applied to source terminal 3. The attenuator 1 decreases the signal's amplitude and the signal will emerge from the load terminal 4 with an amplitude $V_L$. The ratio $V_S/V_L$ is the attenuation ratio. The control voltages $V_{G1}$ and $V_{G2}$ change the resistances of the FET resistors 10 and thus control the attenuation ratio and the input and output impedances of the attenuator. The input and output impedances must be matched for the attenuator to operate properly within the device in which the attenuator is employed.

As stated above, the variable attenuator of the invention may be configured in any topology, such as T, PI or bridged T. The relationship between the attenuation ratio and the control voltages $V_{G1}$ and $V_{G2}$ applied to the FET resistors 10 is directly related to the relationship between the resistance of the FET resistors and the control voltages. The network equations for the T, PI and bridged T configurations are well known to any one skilled in the art. By these equations it is known that the attenuation is a function of the resistor values of the attenuator. Since the resistor value of the FET resistors 10 is a function of the control voltage, it follows that the attenuation is also a function of the control voltage. To achieve a desired relationship between the attenuation and the control voltage, the desired relationship between the channel resistance of FET resistors 10 and the control voltage is determined.

Figure 7:
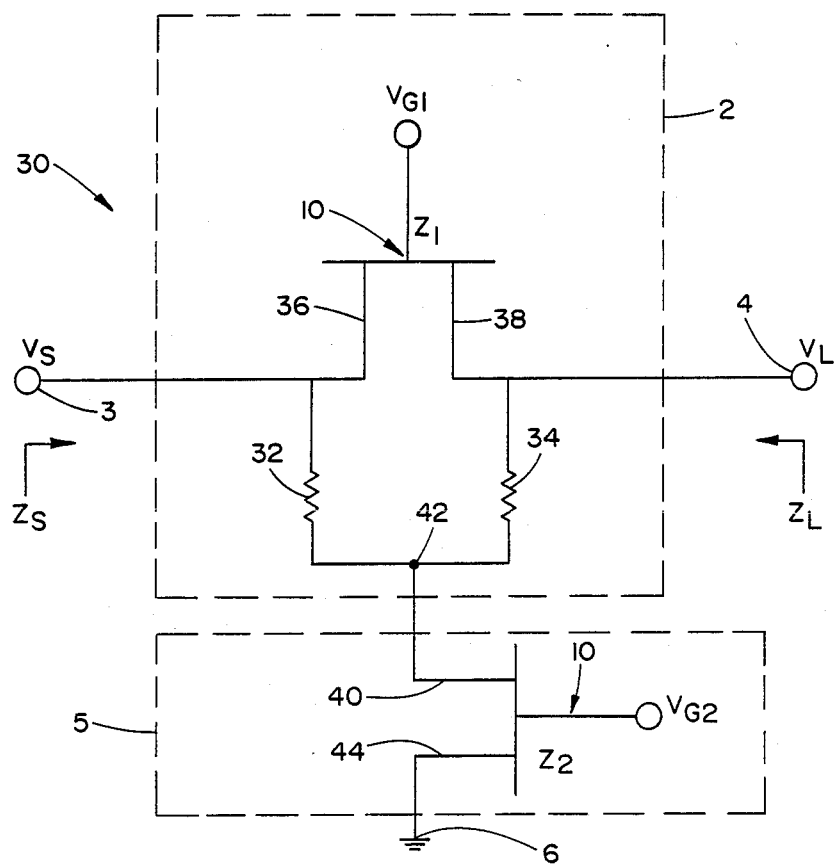
FIG. 7 is a schematic diagram of the attenuator of the present invention in a bridged T configuration.
Figure 8:
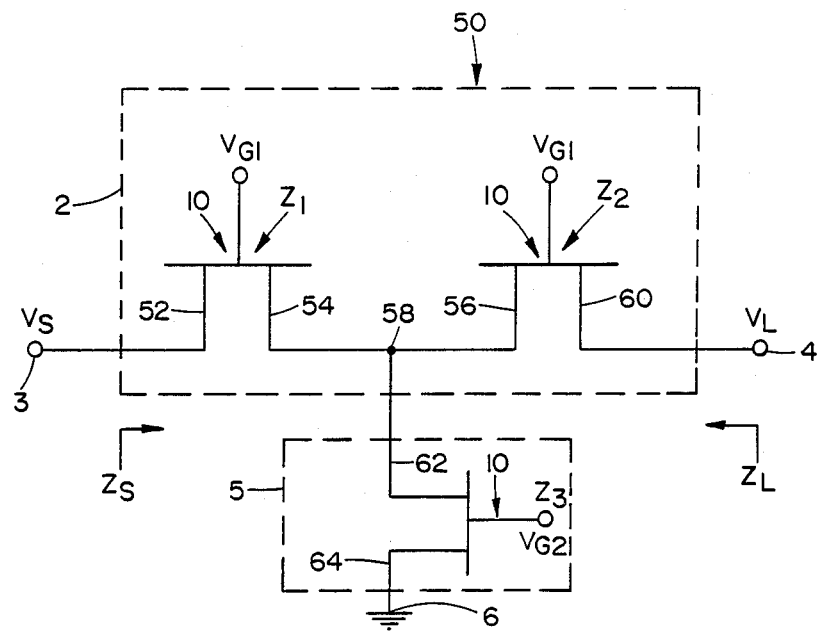
FIG. 8 is a schematic diagram of the attenuator of the present invention in a T configuration.
Figure 9:
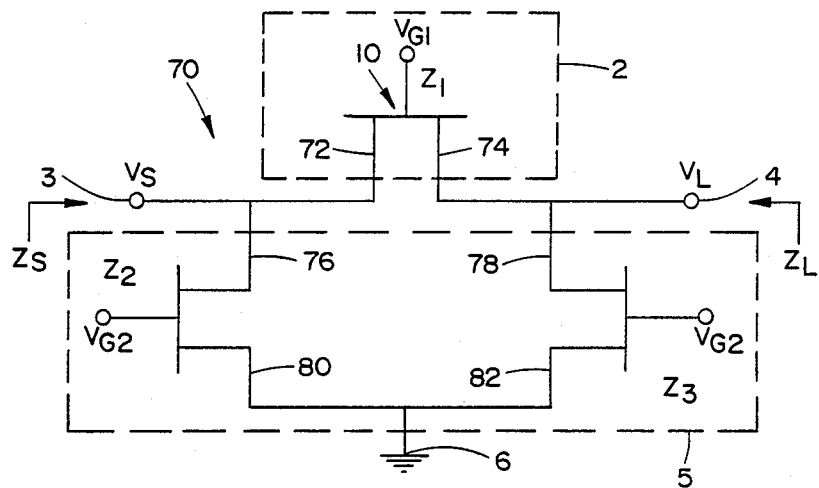
FIG. 9 is a schematic diagram of the attenuator of the present invention in a PI configuration.

FIGS. 7, 8 and 9 are schematic diagrams of the variable attenuator of the invention implemented in the bridged T, T and PI topologies, respectively. FIG. 7 shows a bridged T attenuator 30 in which the first branch circuit 2 includes a first voltage variable FET resistor 10, designated $Z_1$ and two balancing resistors 32 and 34. The two balancing resistors are connected in series between the source and load terminals 3,4. In order to have a reciprocal attenuator, the resistors 32 and 34 must be of equal value. The input terminal 36 of the first FET resistor $Z_1$ is coupled to the source terminal 3 and the output terminal 38 of the first FET resistor, $Z_1$ is coupled to the load terminal 4. The second branch circuit 5 includes a second voltage variable FET resistor 10, designated $Z_2$, having an input terminal 40 coupled to a node 42 between the two balancing resistors 32, 34 and an output terminal 44 coupled to the common terminal 6.

The variable attenuator 50 of FIG. 8 is shown in a T configuration wherein the first branch circuit 2 includes first and second voltage variable FET resistors 10, designated $Z_1$ and $Z_2$ coupled in series between the source and load terminals 3,4. The input terminal 52 of the first FET resistor $Z_1$ is connected to the source terminal 3. The output terminal 54 of the first FET resistor $Z_1$ and input terminal 56 of the second FET resistor $Z_2$ are connected together at a node 58. The output terminal 60 of the second FET resistor $Z_2$ is coupled to the load terminal 4. The second branch circuit 5 includes a third voltage variable FET resistor 10, designated $Z_3$ having an input terminal 62 coupled to the node 58 and an output terminal 64 coupled to the common terminal 6.

The variable attenuator 70 of FIG. 9 is configured in a PI topology wherein the first branch circuit 2 includes a first voltage variable FET resistor 10, designated $Z_1$ having an input terminal 72 coupled to the source terminal 3 and an output terminal 74 coupled to the load terminal 4. The second branch circuit 5 includes second and third voltage variable FET resistors 10, designated $Z_2$ and $Z_3$, coupled in parallel. The input terminal 76 of the second FET resistor $Z_2$ is coupled to the source terminal 3 and the input terminal 78 of the third FET resistor $Z_3$ is coupled to the load terminal 4. The output terminals 80 and 82 of the second and third FET resistors $Z_2$ and $Z_3$ are both coupled to the common terminal 6.

In operation, as stated above, an electrical signal of amplitude $V_S$ is entered upon the input 3 of each of the attenuators of FIGS. 7, 8 and 9. The attenuators decrease the signal's amplitude and the signal emerging from load terminal 4 has an amplitude $V_L$. The attenuation ratio $V_L/V_S$ determines the attenuation in db. By convention, the attenuation in db is equal to 20 log $V_L/V_S$. A 20 db attenuation provides for an output signal $V_L$ that is 10 percent of the input $V_S$. A 40 db attenuation provides an input signal one percent of $V_S$ and a 60 db attenuation provides an output signal 0.1 percent of $V_S$ For each of the attenuators of FIGS. 7, 8 and 9, the control signal $V_{G1}$ is adjusted to change the attenuation while the control signal $V_{G2}$ is adjusted to maintain a match of the input impedance $Z_S$ and the output impedance $Z_L$ to the system's characteristic impedance. The adjustments are made using the known attenuator network equations and the equations governing the resistance of the voltage variable FETs 10.

Figure 10:
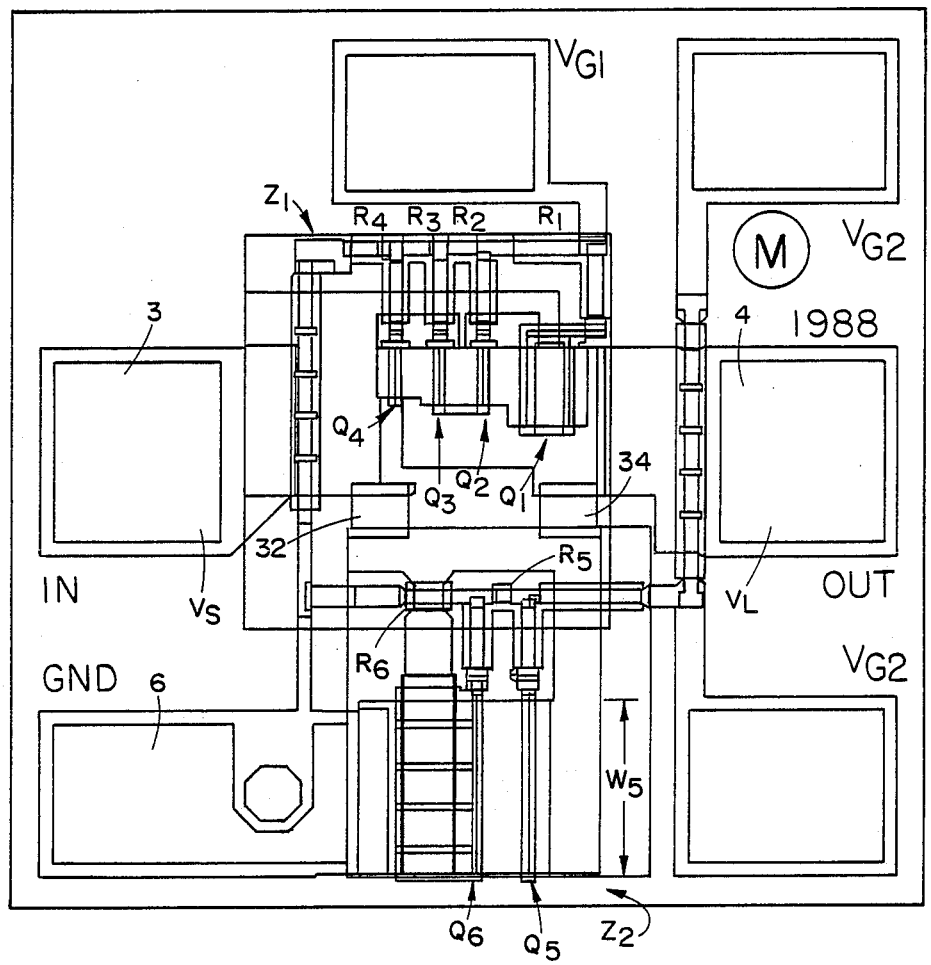
FIG. 10 is a "calma" layout describing a plan view of the bridged T attenuator of the present invention in monolithic form.
Figure 11:
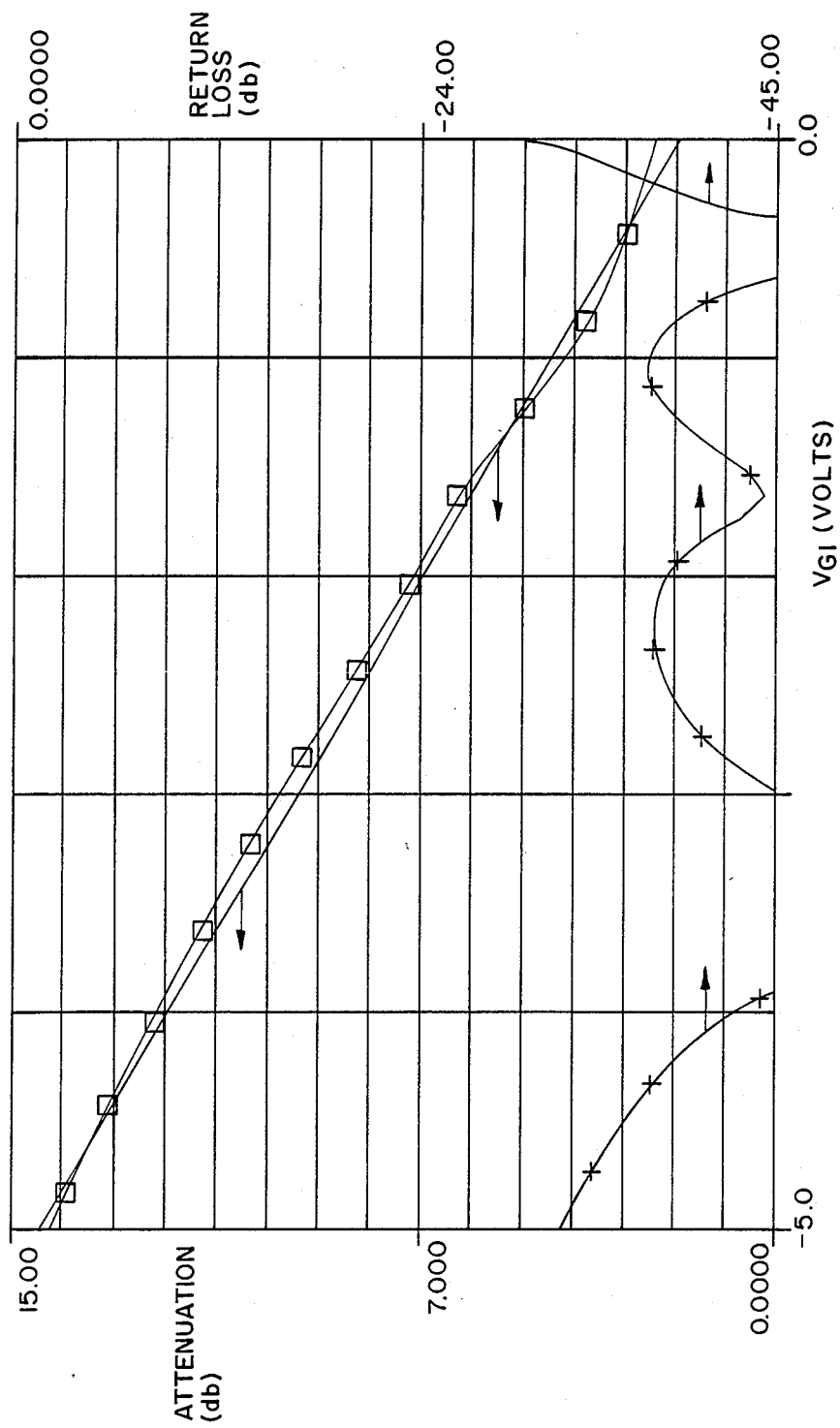
FIG. 11 is a graph of the attenuation versus voltage relationship of a bridged T attenuator of the invention.

In one illustrative embodiment of the invention, the bridged T configuration attenuator 30 is provided with a linear relationship between $V_{G1}$ and the attenuation ratio, while keeping matched impedances on both the input and output. The attenuator 30 is shown in FIG. 10 implemented in monolithic form. The voltage controlled variable FET $Z_1$ of bridged T attenuator 30 is identical to the monolithic FET resistor shown in FIG. 4. The second voltage controlled FET resistor $Z_2$ is shown as having two FET segments Q5 and Q6 each having a gate width of $W_5$ of 125 microns. The resistors for the voltage divider network of the FET resistor $Z_2$ are shown as $R_5$ and $R_6$. The balancing resistors 32 and 34 are as indicated. In this embodiment $R_5$ is equal to 1k ohms and $R_6$ is equal to 2.8k ohms. For a controlled voltage $V_{G1}$ adjusted from 0.0 volts to $-5.0$ volts, a linear attenuation results as shown in FIG. 11. The attenuation varied linearly from 2 db to 15 db. The return loss is also shown in the graph of FIG. 11. The return loss is a measure of the impedance mismatch by measuring the power reflected back to the input. The return loss as shown in FIG. 11 is well within the acceptable range for attenuators. Attached to the application as Appendix A is a copy of a computer simulation program for the bridged T attenuator of FIGS. 7 and 10.

The voltage variable attenuators of the invention are particularly useful in the microwave frequency range, but may also be used in low frequency ranges. The MMIC voltage variable attenuator of the invention features over a 10 db attenuation range, within the DC to 12 GHz frequency band where the attenuation varies linearly with the control voltage. The linearity of the attenuators makes them particularly appealing for applications such as temperature gain compensation of GaAs FET amplifiers.

While illustrative embodiments of the subject invention have been described and illustrated, it is obvious that various changes and modifications can be made therein without departing from the spirit of the present invention which should be limited only by the scope of the appended claims.

What is claimed is:

1. A variable attenuator comprising:

(a) a first branch circuit coupled to a source terminal and a load terminal, said first branch circuit including at least one voltage variable FET resistor having output and input terminals and a control voltage terminal;

(b) a second branch circuit coupled to said first branch circuit and a common terminal, said second branch circuit including at least one voltage variable FET resistor having input and output terminals and a control voltage terminal;

(c) each of said voltage variable FET resistors comprising:

(i) a FET network including a plurality of FET segments having source, drain and gate electrodes, the drain electrodes of each of the plurality of FET segments being coupled to said output terminal, the source electrodes of each of the plurality of FET segments being coupled to said input terminal, and the gate electrodes of each of the plurality of FET segments being coupled to said control voltage terminal, each of said plurality of FET segments having a predetermined gate width; and (ii) a voltage divider network coupled to said gate electrodes of said plurality of FET segments for providing a different predetermined gate voltage to each of said gate electrodes.

2. The variable attenuator of claim 1 wherein the gate width of at least one of the plurality of FET segments is different from the gate width of at least one other of said plurality of FET segments.

3. The variable attenuator of claim 2 wherein said voltage divider network includes a plurality of fixed resistors, at least one of said plurality of fixed resistors being coupled to each of the gate electrodes.

4. The variable attenuator of claim 3 wherein said plurality of FET segments includes n FET segments, wherein n 2, said plurality fixed resistors includes n resistors and wherein the $n^{th}-1$ resistor is connected between the gate electrode of the $n^{th}-1$ and the $n^{th}$ FET segment and the $n^{th}$ resistor is connected between the gate electrode of the $n^{th}$ FET segment and a ground terminal.

5. The variable attenuator of claim 4 wherein each of the n FET segments have a drain electrode to source electrode channel resistance variable as a function of a voltage applied to the gate electrode of each of the n FET segments and as a function of the predetermined gate width of each of the n FET segments.

6. The variable attenuator of claim 5 wherein the gate width of each of the n FET segments and the resistance of each of the n resistors is chosen to provide a predetermined relationship between the control voltage applied to said control voltage terminal and a resistance measured between the input and output terminals, and to thereby provide a preselected relationship between the control voltage applied to the first branch circuit and the ratio between a voltage on said load terminal and a voltage on said source terminal.

7. The variable attenuator of claim 6 wherein said FET network and said voltage divider network are implemented in a monolithic integrated circuit formed on a monolithic semiconductor substrate.

8. The variable attenuator of claim 7 wherein said monolithic semiconductor substrate comprises one of GaAs and Si.

9. The variable attenuator of claim 8 wherein said first and second branch circuits are configured in one of a bridged T, T and PI topologies.

10. The variable attenuator of claim 9 being in a bridged T configuration wherein said first branch circuit includes a first voltage variable FET resistor and two balancing resistors, the two balancing resistors being connected in series between the source and load terminals, an input terminal of said first FET resistor being coupled to said source terminal and an output terminal of said first FET resistor being coupled to said load terminal; and wherein said second branch circuit includes a second voltage variable FET resistor having an input terminal coupled to a node between the two balancing resistors and an output terminal of the FET resistor being coupled to said common terminal.

11. The variable attenuator of claim 9 being in a T configuration wherein said first branch circuit includes first and second voltage variable FET resistors coupled in series between the source and load terminals, an input terminal of the first FET resistor being coupled to said source terminal, an output terminal of the first FET resistor and an input terminal of the second FET resistor being coupled together at a node, an output terminal of the second FET resistor being coupled to the load terminal; and wherein said second branch circuit includes a third voltage variable FET resistor having an input terminal coupled to the node and an output terminal coupled to said common terminal.

12. The variable attenuator of claim 9 being configured in a PI topology wherein said first branch circuit includes a first voltage variable FET resistor having an input terminal coupled to said source terminal and an output terminal coupled to said load terminal; and wherein said second branch circuit includes second and third voltage variable FET resistors coupled in parallel, an input terminal of the second FET resistor being coupled to the source terminal and an input terminal of the third FET resistor being coupled to the load terminal, and output terminals of the second and third FET resistors both being coupled to said common terminal.

13. The variable attenuator of claims 10, 11 or 12 wherein said variable attenuator is implemented in a monolithic integrated circuit formed on a monolithic semiconductor substrate.

14. The variable attenuator of claim 13 wherein said monolithic semiconductor substrate comprises one of GaAs and Si.

15. The variable attenuator of claim 14 implemented in microwave frequency.

16. The variable attenuator of claim 6 wherein said preselected relationship is linear.

17. A variable attenuator comprising:

(a) a first branch circuit coupled to a source terminal and a load terminal, said first branch circuit including at least one voltage variable FET resistor having output and input terminals and a control voltage terminal;

(b) a second branch circuit coupled to said first branch circuit and a common terminal, said second branch circuit including at least one voltage variable FET resistor having input and output terminals and a control voltage terminal;

(c) each of said voltage variable FET resistors comprising:

(i) a FET network comprising a plurality of FET segments having source, drain and gate electrodes, the drain electrode of each of the plurality of FET segments being coupled to an output terminal, the source electrode of each of the plurality of FET segments being coupled to an input terminal and the gate electrode of each of the plurality of FET segments being coupled to a control voltage terminal, each of said plurality of FET segments having a predetermined gate width; and (ii) a voltage divider network coupled to said gate electrodes of said plurality of FET segments for providing a different predetermined gate voltage to each gate electrode;

(d) whereby the relationship between the resistance measured between the output and input terminals and a control voltage applied to the control voltage terminal is predetermined by varying the gate widths of said plurality of FET segments and the gate voltages provided to each of said plurality of FET segments thereby providing a preselected relationship between a ratio between a voltage applied to said source terminal and a voltage present in said load terminal and a control voltage applied to said first branch 18. The variable attenuator of claim 17 wherein the gate width of at least one of the plurality of FET segments is different from the gate width of at least one other of said plurality of FET segments.

19. The voltage variable FET resistor of claim 18 wherein said voltage divider network includes a plurality of fixed resistors, at least one of said plurality of fixed resistors being coupled to each of the gate electrodes of said plurality of FET segments.

20. The voltage variable FET resistor of claim 19 wherein said plurality of FET segments includes n FET segments, wherein $n \geq 2$, said plurality fixed resistors includes n resistors and wherein the $n^{th}-1$ resistor is connected between the gate electrode of the $n^{th}-1$ and the $n^{th}$ FET segment and the $n^{th}$ resistor is connected between the gate electrode of the $n^{th}$ FET segment and a ground terminal.

21. The voltage variable FET resistor of claim 20 wherein each of the n FET segments having a drain electrode to source electrode channel resistance variable as a function of a voltage applied to the gate electrode of each of the n FET segment and as a function of the predetermined gate width of each of the n FET segments.

22. The voltage variable FET resistor of claim 21 wherein said FET network and said voltage divider network are implemented in a monolithic integrated circuit formed on a monolithic semiconductor substrate.

23. The voltage variable FET resistor of claim 22 wherein said monolithic semiconductor substrate comprises one of GaAs and Si.

24. The variable attenuator of claim 23 wherein said first and second branch circuits are configured in one of a bridged T, T and PI topologies.

25. The variable attenuator of claim 24 being in a bridged T configuration wherein said first branch circuit includes a first voltage variable FET resistor and two balancing resistors, the two balancing resistors being connected in series between the source and load terminals, an input terminal of said first FET resistor being coupled to said source terminal and an output terminal of said first FET resistor being coupled to said load terminal; and wherein said second branch circuit includes a second voltage variable FET resistor having an input terminal coupled to a node between the two balancing resistors and an output terminal of the FET resistor being coupled to said common terminal.

26. The variable attenuator of claim 24 being in a T configuration wherein said first branch circuit includes first and second voltage variable FET resistors coupled in series between the source and load terminals, an input terminal of the first FET resistor being coupled to said source terminal, an output terminal of the first FET resistor and an input terminal of the second FET resistor being coupled together at a node, an output terminal of the second FET resistor being coupled to the load terminal; and wherein said second branch circuit includes a third voltage variable FET resistor having an input terminal coupled to the node and an output terminal coupled to said common terminal.

27. The variable attenuator of claim 24 being configured in a PI topology wherein said first branch circuit includes a first voltage variable FET resistor having an input terminal coupled to said source terminal and an output terminal coupled to said load terminal; and wherein said second branch circuit includes second and third voltage variable FET resistors coupled in parallel, an input terminal of the second FET resistor being coupled to the source terminal and an input terminal of the third FET resistor being coupled to the load terminal, and output terminals of the second and third FET resistors both being coupled to said common terminal.

28. The variable attenuator of claims 25, 26 or 27 wherein said variable attenuator is implemented in a monolithic integrated circuit formed on a monolithic semiconductor substrate.

29. The variable attenuator of claim 28 wherein said monolithic semiconductor substrate comprises one of GaAs and Si.

30. The variable attenuator of claim 29 implemented in microwave frequency.

31. The variable attenuator of claim 17 wherein said preselected relationship is linear.

* * * * *

UNITED STATES PATENT AND TRADEMARK OFFICE
CERTIFICATE OF CORRECTION

PATENT NO. : 4,875,023

DATED : October 17, 1989

INVENTOR(S) : Barak Maoz

It is certified that error appears in the above-identified patent and that said Letters Patent is hereby corrected as shown below:

Column 11, line 25, Claim 17: "branch" should read as --branch circuit.--

Signed and Sealed this

Nineteenth Day of November, 1991

*Attest:*

HARRY F. MANBECK, JR.

*Attesting Officer*      *Commissioner of Patents and Trademarks*